United States Patent [19]

Matsumoto et al.

[11] 4,183,751

[45] Jan. 15, 1980

[54] STRIPPING AND DEVELOPING PROCESS AND DEVICE THEREFOR

[75] Inventors: Nobuo Matsumoto; Osami Tsuji; Shinji Hamada, all of Minami-ashigara, Japan

[73] Assignee: Fuji Photo Film Co., Ltd., Minami Ashigara, Japan

[21] Appl. No.: 853,914

[22] Filed: Nov. 22, 1977

[30] Foreign Application Priority Data

May 6, 1977 [JP] Japan ................................. 52-51870

[51] Int. Cl.$^2$ ...................... G03C 11/12; G03C 5/24; G03C 1/90
[52] U.S. Cl. .................... 430/258; 156/344; 156/584; 354/354; 355/100; 355/132; 226/5; 430/260
[58] Field of Search ............................ 96/83, 28, 48 R; 156/344, 584; 354/317, 318, 354; 226/5, 170; 355/100, 85, 132

[56] References Cited

U.S. PATENT DOCUMENTS

| 2,560,301 | 7/1951 | Morrison | 156/344 X |
|---|---|---|---|
| 2,659,673 | 11/1953 | Rogers et al. | 156/344 X |
| 3,518,145 | 6/1970 | Christenson | 156/344 X |
| 3,727,815 | 4/1973 | Schwartz | 156/344 X |
| 3,848,998 | 11/1974 | Yonekura et al. | 355/100 |
| 3,951,727 | 4/1976 | Greenberg | 156/584 |
| 3,970,381 | 7/1976 | Meagher et al. | 156/344 X |
| 4,046,298 | 9/1977 | Schroeder | 156/344 X |
| 4,055,418 | 10/1977 | Buckley et al. | 156/344 X |
| 4,087,182 | 5/1978 | Aiba | 355/100 |

*Primary Examiner*—Edward C. Kimlin
*Attorney, Agent, or Firm*—Sughrue, Rothwell, Mion, Zinn and Macpeak

[57] ABSTRACT

A process for developing a photosensitive material, and a device therefor, are disclosed wherein an image on a photosensitive material consisting of a cover base laminated through the intermediary of a photosensitive layer to a support member is developed into a visible image by stripping the cover base from the support member. A preliminary stripping step of stripping the cover base from the support member in the leading end portion thereof is first performed. This is immediately followed by the reorientation of the leading end portion of the cover base to bring the same into registration with the support member. Therefore, a final stripping step is performed wherein the cover base is successively separated from the leading end portion thereof towards the trailing end thereof from the support member.

10 Claims, 13 Drawing Figures

STRIPPING AND DEVELOPING PROCESS AND DEVICE THEREFOR

BACKGROUND OF THE INVENTION

This invention relates to a process for developing a photosensitive material, and a device therefor, wherein an image on a photosensitive material consisting of a cover base laminated through the intermediary of a photosensitive layer to a support member is developed into a visible image by stripping the cover base from the support member.

With a photosensitive material consisting, for example, of a support member such as an aluminum plate, a photosensitive layer containing a photo-hardening material, and a cover base having a photo-transmitting property, such as a polyethylene terephthalate film, and having a characteristic in which an area of the photosensitive layer exposed to light is cured to be stuck to the support member and an area unexposed thereof is stuck to the cover base, an image on the photosensitive material is developed as a resist image on the support member by stripping the cover base from the photosensitive material.

One prior method for developing such a photosensitive material has been such that development is achieved by sticking an adhesive tape to the surface of a cover base and taking up the adhesive tape for stripping the cover base from the support member. Such a device, however, requires extra material, i.e., the adhesive tape, and also an adhesive tape feed mechanism, resulting in increased manufacturing and running costs. Furthermore, such a device does not always perform satisfactorily due to insufficient adhesion of the adhesive tape to the cover base.

Another prior process includes a roller provided with suction holes in the peripheral surface thereof, so that the cover base is stripped under suction for development. This process requires a vacuum pump and an air control mechanism, resulting in an increased size of the device itself, and hence an increased cost.

SUMMARY OF THE INVENTION

It is an object of the present invention to provide a stripping and developing process improved over the arts disclosed in the aforesaid patent and utility model applications, which comprises a preliminary stripping step having a friction means for facilitating the stripping of a cover base, and a final stripping and developing step, thereby producing better results.

To attain the object described, there is provided according to the present invention a stripping and developing process for a photosensitive material consisting of a cover base laminated through the intermediary of a photosensitive layer to a support member, wherein a cover base is stripped from the support member, thereby developing an image into a visible image on the support member, the stripping and developing process being characterized by a preliminary stripping step of stripping the cover base in the leading end portion of the photosensitive material being transported, due to friction in a direction opposite an advancing direction of the photosensitive material, followed by the reorienting of the leading end portion of cover base thus separated to the advancing direction of the photosensitive material, so as to bring the cover base into registration with the support member, and a final stripping and developing step of stripping the cover base of photosensitive material subjected to the preliminary stripping from the leading end portion thereof and consecutively to the trailing end, thereby separating the cover base from the support member completely. Hitherto, the failure of stripping of a cover base from a support member is likely to occur due to the misalignment of the leading end of the cover base partly separated with that of the support member, which misalignment results from the turning-up of the leading end of cover base during the transportation of the photosensitive material from the preliminary stripping step to the final stripping and developing step, or due to formation of a gap between the cover base surface and the suction surface where a suction system is adopted as a stripping and developing means (although suction is weak). To avoid this, according to the process of the present invention, the leading end of a cover base stripped from a support member for ease of separation in the succeeding final stripping step is caused to register with the support member, so that the photosensitive material may be transported to the final stripping and developing step, with the cover base maintained in a condition of being readily separable.

The preliminary stripping step consists of the steps of stripping the cover base at the leading end thereof from a support member, and bringing the leading end of cover base thus separated into registration with the support member. In the step of stripping the leading end of the cover base from the support member, a friction means is operated in a direction opposite the advancing direction of the photosensitive material, so as to cause friction therebetween. Friction means may utilize a material having a fine, sharp rough surface, such as a file material, or a material in the form of a brush. The configuration of the friction means has no particular limitation, but preferably it is in the form of a file or in the form of roller or belt. The step of bringing the leading end of cover base once separated into registration with the support member may be achieved by rotating the friction means in a direction reverse to the direction of stripping the cover base, at a speed higher than the speed of shift of the photosensitive material, or by providing a restoration means separately from the friction means.

DETAILED DESCRIPTION OF THE INVENTION

Figure 1:
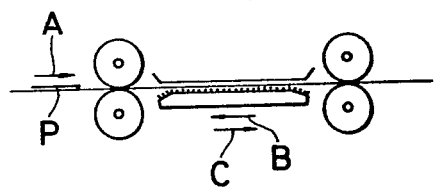
FIGS. 1 through 6 are side views of a preliminary stripping step of the present invention, shown in various modes.
Figure 2:
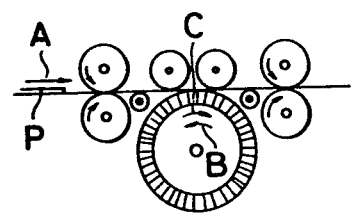
Figure 3:
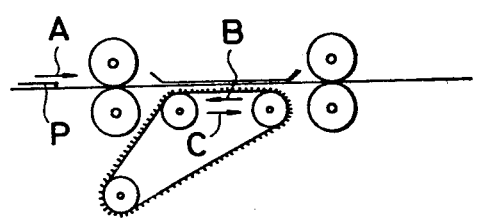

In the embodiments shown in FIGS. 1 through 3, a friction means for facilitating the stripping of a cover base in the succeeding final stripping step also serves as a means for causing the cover base to register with the support member. In FIG. 1, there is provided a friction means in the form of a plate having a rough surface or having a number of filaments of hard material on the surface thereof. FIG. 2 shows a friction means in the form of a roller, the peripheral surface of which is molded in the form of a brush, or to the peripheral surface of which is attached a tape having a number of filaments of hard material. FIG. 3 shows a friction means in the form of belt having thereon a number of filaments of hard material. In each of these embodiments, respective friction means are operated in the direction of arrow B to strip the cover base at the leading end thereof from the support member, and then operated in the direction of arrow C to restore the direction of the cover base so as to register with the support member.

Figure 4:
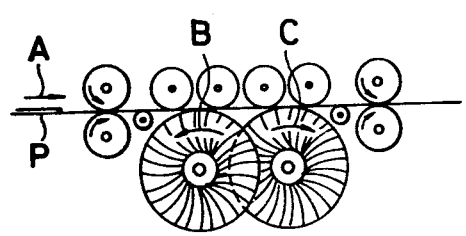
Figure 5:
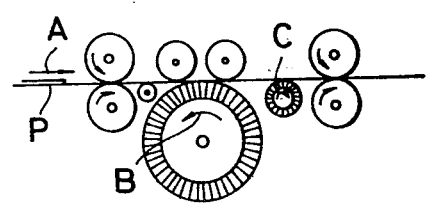
Figure 6:
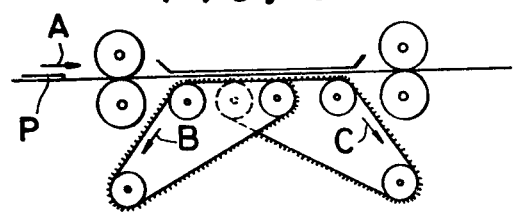

FIGS. 4 through 6 show further embodiments in which a restoration means is provided, separately from the friction means, for registration of the leading end portion of the cover base with that of the support member. In FIG. 4, first brush rollers arranged in side by side relation are rotated, as a friction means, in the direction of arrow B, and second brush rollers are arranged in side by side relation in a manner that one brush roller element of the latter is inserted in engagement between the neighboring brush roller elements of the frame and rotated in the direction of arrow C as a restoration means. FIG. 5 includes a diametrically large brush roller serving as a friction means, and a diametrically small brush roller serving as a restoration means and spaced apart from the diametrically large brush roller. In this embodiment, the friction means is rotated in the direction of arrow B independently of the retoration means which in turn is rotated in the direction of arrow C. In FIG. 6, a group of endless belts arranged in side by side relation and having a number of filaments of hard material on the surfaces thereof are rotated, as a friction means, in the direction of arrow B, and another group of endless belts arranged in side by side relation in a manner that one belt element thereof is between the neighboring belt elements of the former group of endless belts and having a number of filaments of hard material are rotated as a restoration means in the direction of arrow C.

The final stripping step is for stripping the whole of the cover base from the support member first from the leading end portion consecutively to the trailing end, the leading end portion of the cover base having been subjected to the preliminary stripping and brought into registration with the support member in the preliminary stripping step. In this final stripping step, the cover base is stripped from the support member first from the leading end consecutively to the trailing end, thus the cover base is separated from the support member completely. There may be employed in this step a stripping means serving as a separating means as well, or the combination of a stripping means and a separating means. The stripping means may utilize any of suction, air-blowing, separating blade and friction. Applicable as a separating means are such as a transporting roller, transporting belt, a reciprocating link mechanism with a means for clamping the leading end of the cover base, or a means for pulling the cover base by arresting the leading end or side edge of the cover base by a needle or pawl.

Figure 7:
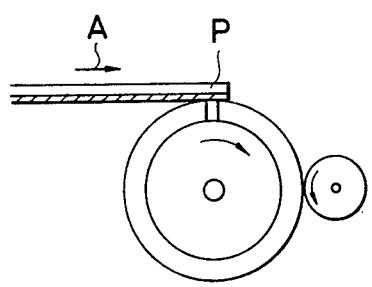
FIGS. 7 through 12 are side views of a final stripping steps, respectively.
Figure 8:
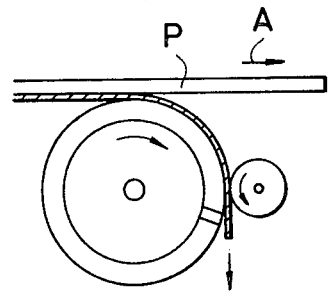
Figure 9:
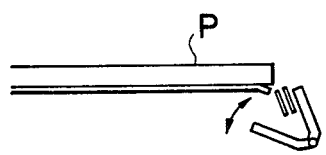
Figure 10:
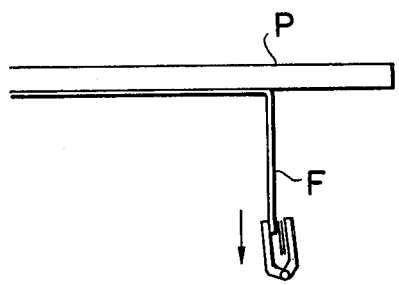

In FIG. 7, there is employed a stripping means consisting of a suction roller and a nip roller. In this embodiment, the leading end of the cover base subjected to the preliminary stripping, when it reaches a suction port of the suction roller, is attracted under suction due to decreased pressure to the peripheral surface of the suction roller, then pulled downwards with the rotation of the suction roller, and inserted between the nip roller and the suction roller. At this instant, suction due to decreased pressure is relieved, and the cover base is wholly separated from the support member by the rotation of the suction roller and the nip roller, as shown in FIG. 8. FIG. 9 shows a stripping means having a clamping and pulling pawl, wherein the clamping pawl has a wire brush in the tip portion thereof and closes while scrubbing the leading end of the cover base subjected to the preliminary stripping, and are shifted downwards, with the leading end of the cover base clamped between the tips thereof, thereby separating the cover base from the support member, in the manner shown in FIG. 10.

Figure 11:
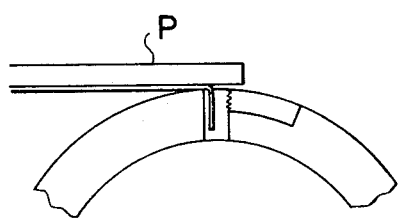
Figure 12:
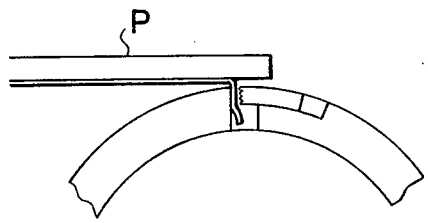

In FIG. 11, a suction roller incorporating a clamping pawl is provided as a stripping means. In this embodiment, the leading end of the cover base subjected to the preliminary stripping is led under suction into a suction hole in the suction roller, then a pawl facing the suction hole is caused to slide to a position shown in FIG. 12, and the suction roller is rotated to separate the cover base from the support member.

Figure 13:
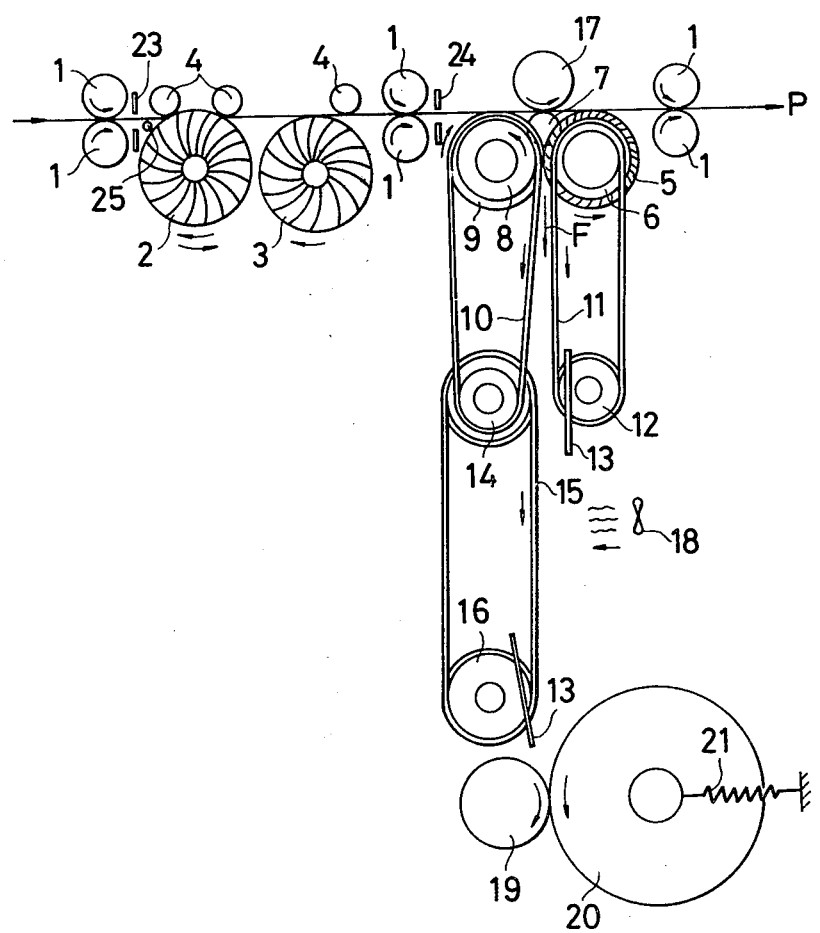
FIG. 13 is a side view of a stripping and developing device for effecting a preliminary stripping step and a final stripping step consistently, according to an embodiment of the present invention.

A device for achieving the preliminary stripping step and the final stripping and developing step consistently is shown in FIG. 13, which is convenient for embodying the present invention. Referring more specifically to FIG. 13, photosensitive material P is shifted from the left to the right as viewed in the drawing by a pair of transporting rollers 1 with its cover base surface directed downwards. When the leading end of photosensitive material P is detected by detectors 23, then preliminary stripping brush 2 and restoration brush 3 start rotating in he counterclockwise direction and in the clockwise direction, respectively. By the time at which photosensitive material P is shifted to a point at which the leading end thereof contacts preliminary stripping brush roller 2, and cover base F is stripped at the leading end from the support member, then the rotation in the counterclockwise direction, of preliminary stripping brush roller 2 is reversed (namely, in the clockwise direction) under control of a counter (not shown) which has counted from the time at which the leading end of photosensitive material P has been detected by detectors 23. Cover base F separated in the leading end portion thereof from the support member is brought into registration with the support member by the rotation, in the clockwise direction, of preliminary stripping brush roller 2 and restoration brush roller 3. When photosensitive material P is shifted further rightwards, and the leading end thereof is detected by detectors 24, then a final stripping brush roller 5 starts rotating in the counterclockwise direction at a high speed, to thereby separate cover base F from the support member which has been in registration therewith following the preliminary stripping, and the leading end of cover base F is caused to enter between a separating roller 6 rotating in the same direction as that of the final stripping brush roller 5 coaxially therewith and a diametrically small nip roller 7 opposing thereto. Then, final stripping brush roller 5 and separating roller 6 are rotated in the clockwise direction through a given angle under control of another counter (not shown) which has counted from the initiation of the operation of detectors 24, while separating roller 6 is in contact with nip roller 7 at a point of contact between nip roller 7 and a press roller 17. As a result, final stripping brush roller 5 and separating roller 6 are displaced downwards from the photosensitive-material transporting passage (the horizontal direction from the left to the right in the drawing), so that these rollers no longer contact the surface of support member from which cover base F has been stripped, and hence the support member surface has no likelihood of being damaged by these rollers.

Cover base F thus separated is guided, past a passage between the assembly of a back-up roller 8 which supports nip roller 7 and an auxiliary roller 9 coaxial with the back-up roller and rotating in the clockwise direction independently of the back-up roller and the separating roller 6, and past a passage between two transporting belts 10, 11, towards a transporting belt 15 to which air is blown from a fan 18 positioned to the right of the belt 15, and then transported downwards along the transporting belt 15. Cover base F then enters between a press roller 19 and a take-up roll 20 urged against press roller 19 under the force of a spring 21. Since cover base F is moved downwards with its adhesive surface directed to the right, the cover base can adhere to the periphery of take-up roll 20 by virtue of the adhesion of the cover base itself and the action of press roller 19, thereby being continuously taken up to the roll 20.

Brush roller 2 used in the preliminary stripping step in the embodiment shown needs to be comparatively high in stiffness when contacting the cover base. The length of the brush element may be longer for a stiff resilient material, but preferably is short for a soft resilient material. The brush material, whether it is a natural material or an artificial material, may be in the form of a bundle of metallic or plastic filaments, or in the form of a brush. As an alternative, a plastic or rubber roller may be used, having a number of fine projections on the surface thereof. The material for nip roller 7 used in the final stripping step is preferably large in coefficient of friction, such as plastic or rubber.

The stripping and developing process according to the present invention enables the positive separation of the cover base from the support member by a mechanism simple in construction, dispensing with any extra material such as an adhesive tape and without causing any damage to the support member surface. If the leading end portion of photosensitive material which is to be subjected to the preliminary stripping is exposed to light beforehand then adhesion of the cover base in the area exposed to light to the photosensitive layer becomes lowered, resulting in a difference in adhesion between in the exposed area and in the unexposed area of photosensitive material. This facilitates, in the preliminary stripping step, the positive separation of the cover base only in the leading end portion exposed to light.

What is claimed is:

1. A stripping and developing process for a photosensitive material consisting of a cover base laminated through the intermediary of a photosensitive layer to a support member, wherein the cover base is stripped from the support member thereby providing a visible image on the support member, said stripping and developing comprising the steps of
    a preliminary stripping step of stripping said cover base from said support member in the leading end portion of said photosensitive material, said stripping being due to friction in a direction opposite to an advancing direction of said photosensitive material, followed by the reorientation of the leading end portion of said cover base to the advancing direction of said photosensitive material, thereby bringing the leading end portion of said cover base into registration with said support member, wherein the reorientation of the leading end portion of said cover base to the advancing direction of said photosensitive material is accomplished by friction in the direction of the advancing direction of said photosensitive material, and
    a final stripping step of stripping said cover base of said photosensitive material after said preliminary stripping step first from the leading end portion thereof successively towards the trailing end thereof, whereby the cover base is completely separated from the support member.

2. The stripping and developing process as recited in claim 1 wherein said final stripping step is accomplished by separating and clamping the leading end portion of said cover base and thereafter separating the cover base from the leading end portion towards the trailing end thereof from said support member by pulling.

3. A stripping and developing device for a photosensitive material consisting of a cover base laminated through the intermediary of a photosensitive layer to a support member, wherein the cover base is stripped from the support member thereby providing a visible image on the support member, said stripping and developing device comprising:
    means for preliminarily stripping said cover base from said support member in the leading end portion of said photosensitive material, said stripping being due to friction in a direction opposite to an advancing direction of said photosensitive material, and for thereafter reorientating the leading end portion of said cover base to the advancing direction of said photosensitive material, thereby bringing the leading end portion of said cover base into registration with said support member, wherein the reorientation of the leading end portion of said cover base to the advancing direction of said photosensitive material is accomplished by friction in the direction of the advancing direction of said photosensitive material, and
    means for finally stripping said cover base of said photosensitive material by separating and clamping the leading end portion of said cover base and thereafter separating said cover base from the leading end portion towards the trailing end thereof from said support member.

4. The stripping and developing device as recited in claim 3 wherein said means for preliminarily stripping and reorienting a friction means in the form of a plate in contact with said cover base.

5. The stripping and developing device as recited in claim 3 wherein said means for preliminarily stripping and reorienting comprises a friction means in the form of at least one brush roller in contact with said cover base.

6. The stripping and developing device as recited in claim 3 wherein said means for preliminarily stripping and reorienting comprises a friction means in the form of at least one belt having thereon a number of hard filaments in contact with said cover base.

7. The stripping and developing device as recited in claim 3 wherein said means for finally stripping comprises a suction roller in contact with said cover base for separating the leading end portion thereof and a nip roller in contact with said suction roller for clamping said leading end portion, the rotation of said suction roller and said nip roller separating said cover base from the leading end portion towards the trailing end thereof from said support member.

8. The stripping and developing device as recited in claim 3 wherein said means for finally stripping comprises a clamping and pulling pawl having a wire brush in the tip portion thereof, said pawl closing while scrubbing the leading end portion of said cover base and thereafter being shifted away from said support member.

9. The stripping and developing device as recited in claim 3 wherein said means for finally stripping comprises a suction roller incorporating a clamping pawl, said suction roller being in contact with said cover base for first separating and then clamping the leading end portion thereof, the rotation of said suction roller separating said cover base from the leading end portion towards the trailing end thereof from said support member.

10. The stripping and developing device as recited in claim 3 wherein said means for finally stripping comprises a friction means for separating the leading end portion of said cover base, and a separating roller and a nip roller for clamping said separated end portion, the rotation of said separating roller and said nip roller separating said cover base from the leading end portion towards the trailing end thereof from said support member.

* * * * *